(12) United States Patent
Weisbuch et al.

(10) Patent No.: US 7,291,864 B2
(45) Date of Patent: Nov. 6, 2007

(54) SINGLE OR MULTI-COLOR HIGH EFFICIENCY LIGHT EMITTING DIODE (LED) BY GROWTH OVER A PATTERNED SUBSTRATE

(75) Inventors: Claude C. A. Weisbuch, Paris (FR); Aurelien J. F. David, Paris (FR); James S. Speck, Goleta, CA (US); Steven P. DenBaars, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/067,910

(22) Filed: Feb. 28, 2005

(65) Prior Publication Data
US 2006/0202226 A1 Sep. 14, 2006

(51) Int. Cl.
*H01L 29/22* (2006.01)
(52) U.S. Cl. .................. 257/98; 257/79; 257/435; 257/436; 257/E33.067; 257/E51.021
(58) Field of Classification Search ............ 257/98, 257/79, 435, 436, E33.067, E51.021
See application file for complete search history.

(56) References Cited

U.S. PATENT DOCUMENTS

| | | | |
|---|---|---|---|
| 5,226,053 A | 7/1993 | Cho et al. | |
| 5,362,977 A | 11/1994 | Hunt et al. | |
| 5,568,311 A * | 10/1996 | Matsumoto | ........... 359/344 |
| 5,779,924 A | 7/1998 | Krames et al. | |
| 5,882,951 A * | 3/1999 | Bhat | ............ 438/40 |
| 6,163,038 A | 12/2000 | Chen et al. | |
| 6,504,180 B1 | 1/2003 | Heremans et al. | |
| 6,525,464 B1 | 2/2003 | Chin | |
| 6,538,371 B1 | 3/2003 | Duggal et al. | |
| 6,611,003 B1 * | 8/2003 | Hatakoshi et al. | ............ 257/98 |
| 6,743,648 B2 * | 6/2004 | Kise et al. | ........... 438/22 |
| 7,098,589 B2 | 8/2006 | Erchak et al. | |
| 2003/0178626 A1 | 9/2003 | Sugiyama et al. | |
| 2005/0205884 A1 | 9/2005 | Kim et al. | |
| 2006/0194359 A1 * | 8/2006 | Weisbuch et al. | ............ 438/35 |

OTHER PUBLICATIONS

H. Benistry et al., "Impact of Planar Microcavity Effects on Light Extraction—Part I: Basic Concepts and Analytical Trends," 1998, IEEE J. Quantum Electron, vol. 34:1612-1631.

(Continued)

*Primary Examiner*—Andy Huynh
(74) *Attorney, Agent, or Firm*—Gates & Cooper LLP

(57) ABSTRACT

A single or multi-color light emitting diode (LED) with high extraction efficiency is comprised of a substrate, a buffer layer formed on the substrate, one or more patterned layers deposited on top of the buffer layer, and one or more active layers formed on or between the patterned layers, for example by Lateral Epitaxial Overgrowth (LEO), and including one or more light emitting species, such as quantum wells. The patterned layers include a patterned, perforated or pierced mask made of insulating, semiconducting or metallic material, and materials filling holes in the mask. The patterned layer acts as an optical confining layer due to a contrast of a refractive index with the active layer and/or as a buried diffraction grating due to variation of a refractive index between the mask and the material filling the holes in the mask.

33 Claims, 15 Drawing Sheets

OTHER PUBLICATIONS

M. Boroditsky et al., "Light-Emitting Diode Extraction Efficiency," 1997, Proceedings of the SPIE—The International Society for Optical Engineering, SPIE-Int. Soc. Opt. Eng., vol. 3002:119-122.

D. Delbeke et al., "High-Efficiency Semiconductor Resonant-Cavity Light-Emitting Diodes: A Review," 2002, IEEE J. on selected topic in Quant.tum Electronics, vol. 8(2):189-206.

N. Eriksson, et al., "Highly Directional Grating Outcouplers with Tailorable Radiation Characteristics," 1996, IEEE J. Quantum Electronics, vol. 32, No. 6, 1038-1047.

X. Guo et al., "Phonton Recycling Semiconductor Light Emitting Diode," 1999, IEDM, International Electron Devices Meeting, Technical Digest, IEDM-99, 600-603.

W. Lukosz, "Light emission by multipole sources in thin layers. I. Radiation patterns of electric and magnetic dipoles" 1981, J. Opt. Soc. Am. ,vol. 71:744-754.

M. Rattier, et al., "Omnidirectional and compact guided light extraction from Archimedean photonic lattices," 2003, Appl. Phys. Lett., vol. 83, No. 7: 1283-1285.

M. Rattier, et al., "Toward Ultrahigh-Efficiency Aluminum Oxide Microcavity Light- Emitting Diodes: Guided Mode Extraction by Photonic Crystals" 2002, IEEE Sel. Top. Quantum Electronics. vol. 8, No. 2: 238-247.

I. Schnitzer et al., "30% external quantum efficiency from surface textured, thin-film light emitting diodes," 1993, Applied Physics Letters, 63, No. (16) 2174-2176.

T. Suhara, et al, "Broad area and MOPA lasers with integrated grating components for beam shaping and novel functions," 2003, Proc. SPIE vol. 4995, p. 10-21.

* cited by examiner

SINGLE OR MULTI-COLOR HIGH EFFICIENCY LIGHT EMITTING DIODE (LED) BY GROWTH OVER A PATTERNED SUBSTRATE

CROSS-REFERENCE TO RELATED APPLICATIONS

This application is related to the following co-pending and commonly-assigned applications:

U.S. application Ser. No. 10/938,704, filed Sep. 10, 2004, by Carole Schwach, Claude C. A. Weisbuch, Steven P. DenBaars, Henri Benisty, and Shuji Nakamura, entitled "WHITE, SINGLE OR MULTI-COLOR LIGHT EMITTING DIODES BY RECYCLING GUIDED MODES,"

U.S. Application Ser. No. 11/067,957, filed on Feb. 28, 2005, by Claude C. A. Weisbuch, Auxelien J. F. David, James S. Speck and Steven P. DenBaars, entitled "Horizontal emitting, vertical emitting, beam shaped, Distributed Feedback (DEB) lasers by growth over A patterned substrate," and U.S. Application Ser. No. 11/067,956, filed on Feb. 28, 2005, by Aurelien J. F. David, Claude C. A. Weisbuch and Steven P. DenBaars, entitled "HIGH EFFICIENCY LIGHT EMITTING DIODE (LED) WITH OPTIMIZED PHOTONIC CRYSTAL EXTRACTOR," which applications are incorporated by reference herein.

STATEMENT REGARDING SPONSORED RESEARCH AND DEVELOPMENT

The present invention was made under support from the University of California, Santa Barbara Solid State Lighting and Display Center member companies, including Stanley Electric Co., Ltd., Mitsubishi Chemical Corp., Rohm Co., Ltd., Cree, Inc., Matsushita Electric Works, Matsushita Electric Industrial Co., and Seoul Semiconductor Co., Ltd.

BACKGROUND OF THE INVENTION

1. Field of the Invention

The invention is related to light emitting diodes (LEDs), and more particularly, to a single or multi-color LED by growth over a patterned substrate.

2. Description of the Related Art

A light emitting diode (LED) is a semiconductor device that emits light in a stimulated manner when electrically biased in the forward direction. This effect is a form of electroluminescence.

An LED is comprised of a chip of semiconducting material impregnated, or doped, with impurities to create a structure called a pn junction. When biased forwardly, electrons are injected into the junction from the n-region and holes are injected from the p-region. The electrons and holes release energy in the form of photons as they recombine. The wavelength of the light, and therefore its color, depends on the bandgap energy of the materials forming the pn junction.

As semiconductor materials have improved, the efficiency of semiconductor devices has also improved and new wavelength ranges have been used. Gallium nitride (GaN) based light emitters are probably the most promising for a variety of applications. GaN provides efficient illumination in the ultraviolet (UV) to amber spectrum, when alloyed with varying concentrates of indium (In), for example.

Unfortunately, most of the light emitted within a semiconductor LED material is lost due to total internal reflection at the semiconductor-air interface. Typical semiconductor materials have a high index of refraction, and thus, according to Snell's law, most of the light will remain trapped in the materials, thereby degrading efficiency. By choosing a suitable geometry for the LED, a higher extraction efficiency can be achieved.

FIG. 1 is a cross-sectional view of a homogeneous light-emitting material 10 that illustrates that a fraction of the light 12 emitted inside the material 14 is inside the escape cone 16 and can escape the material 10, while a large fraction of the emitted light 18 is trapped and reflected within the material 10. In this situation, the reflected light 18 is referred to as guided light modes, or guided modes, because the light 18 is confined within the device 10 and guided transversely within the material 10.

One method for reducing the effects of the total internal reflection is to create light scattering or redistribution through random texturing of the surface of the device, which leads to multiple variable-angle incidence at the semiconductor-air interface of the device. This approach has been shown to improve emission efficiency by 9-30%, as a result of the very high internal efficiency and low internal losses, which allows many passes for light before it escapes from the device.

FIG. 2 is a cross-sectional view of a semiconductor LED 20 that illustrates this concept, wherein the top surface 22 of the LED 20 is textured, the bottom surface 24 of the LED 20 comprises a reflector, the air has a refractive index of n=1, and the semiconductor material of the LED 20 has a refractive index of n=3.5. The textured top surface 22 of the LED 20 is used to randomize light trajectories in a geometrical optics approach.

Another method to reduce the percentage of light trapped is to use a Resonant-Cavity LED (RCLED) or Micro-Cavity LED (MCLED). MCLEDs offer opportunities to create solid-state lighting systems with greater efficiencies than existing systems using "traditional" LEDs. As a result of incorporating a gain medium within a resonant cavity, MCLEDs emit a highly compact and directional light beam. The higher extraction efficiency and greater brightness of these devices are the main advantages of these technologies over conventional LEDs.

Extraction efficiency refers to the ability of the photons generated by a particular system to actually exit the system as "useful" radiation. This higher extraction efficiency is, however, limited to values in the 40% range as the microcavity structure also leads to very efficient emission into guided modes and leaky modes. Thus, it would be useful if these guided modes could be extracted.

As noted above, guided modes are modes that are guided in the device plane due to the index difference between the structure layers. Leaky modes are radiated through the layers, towards the air or substrate. Leaky modes are usually lost as they undergo multiple total internal reflection at interfaces, travelling back and forth within the device, until their energy is dissipated by various loss mechanisms (e.g., metal mirror loss, free carrier absorption, re-absorption by the active layer, etc.).

FIG. 3 is a cross-sectional view of a semiconductor LED 26 that illustrates radiating, guided and leaky modes, wherein the LED 26 includes a substrate 28, a buffer layer 30, and an active layer 32 including quantum wells (QWs) 34. Part of the emitted light is extracted 36 towards the air and forms radiative modes 36, part of the emitted light leaks 38 through the various layers of the device 26 into the substrate 28 and forms leaky modes 38, and part of the emitted light is reflected 40 in the active layer 32 (or in both the active layer 32 and buffer layer 30) and forms guided modes 40.

To obtain high efficiency LEDs, it is necessary to optimize light emission 36 outside the structure, minimize the leaky modes 38 and guided modes 40 emission, and possibly re-emit the guided modes emission 40, as well as part of the leaky modes 38 emission. The present invention aims at fulfilling this goal, in structures amenable to easy fabrication.

FIGS. 4A-4B and 5A-5B illustrate the structures (FIGS. 4A and 5A) and simulations (FIGS. 4B and 5B) of microcavity emission, via a bottom metal or distributed Bragg reflector (DBR) mirror, and a single interface with air at the top, in a gallium nitride (GaN) materials system. FIGS. 4B and 5B are angular emission diagrams inside the semiconductor, on a log scale, wherein FIG. 4B shows the emission of the structure of FIG. 4A, and FIG. 5B that of FIG. 5A. For both FIGS. 4B and 5B, the left half of the figure shows the transverse magnetic (TM) emission and its right half shows the transverse electric (TE) polarized emission. Only in-plane monochromatic dipoles are assumed.

In FIG. 4A, the structure includes a metal mirror 42, and an active layer 44 including quantum wells 46, wherein the structure is a $3\lambda/4$ cavity with the quantum wells 46 placed at $\lambda/4$ (48) of the metal mirror 42. In FIG. 4B, arrow 50 shows emission towards the air, while arrow 52 shows emission towards the substrate. Also in FIG. 4B, braces 36 indicate extracted light, and brace 40 indicates guided modes.

In FIG. 5A, the structure includes a buffer 54, 7 period DBR mirror 56 and active layer 58 including quantum wells 60, wherein the structure is a $\lambda$ cavity with the quantum wells 60 placed at $\lambda/2$ (62) of the 7 period DBR mirror 56. In FIG. 5B, arrow 64 shows emission towards the air, while arrow 66 shows emission towards the substrate. Also in FIG. 5B, braces 36 indicate extracted light, braces 38 indicate leaky modes, and brace 40 indicates guided modes.

Extraction efficiency from these structures is, respectively, in FIG. 4A, 31% and 24% in air, and in FIG. 5A, 44% and 27% in epoxy.

Difficulties are encountered in most materials systems when attempting to obtain large micro-cavity extraction improvements of LEDs. FIGS. 4B and 5B show the emission diagrams from which is extracted the expected efficiency of optimized GaN micro-cavity LEDs, and illustrate the following issues:

(i) The index contrast for materials epitaxially grown is quite limited, in particular for the very important nitride materials. This is why emission into many leaky modes is seen in the DBR mirror 56 structure of FIG. 5A, which make the DBR mirror 56 structure of FIG. 5A less efficient than the metal mirror 42 of FIG. 4A.

(ii) The displayed efficiencies are only possible because very thin structures were considered, leading to low-order cavities (as described in reference 10 below). It is difficult to obtain such thin active layers. For example, it is usually necessary to grow a thick (several microns) buffer layer of nitride on a substrate before growing good quality material for the active layer. While lifting off the nitride materials (buffer layer and active layer) from the substrate is already a delicate operation, there is, in addition, extreme difficulty in obtaining the thinner layers (i.e., further removing part or all of the buffer layer) bounded by good metal mirrors, which would lead to the excellent performance of the thin metal mirror structure shown in FIG. 4A.

Thus, there is a need in the art for improved LED structures that provide increased light extraction efficiency. In addition, there is a need in the art for improved LED structures relying on optimized direct or radiative mode emission outside the structure, minimize leaky mode emission, and re-emitted guided mode emission. Moreover, there is a need to provide such improved LEDs while retaining a planar fabrication process, in order to render such structures amenable to easy fabrication. The present invention satisfies these needs.

SUMMARY OF THE INVENTION

The present invention discloses a single or multi-color light emitting diode (LED) with high extraction efficiency comprised of a substrate, a buffer layer grown on the substrate, a patterned layer deposited on top of the buffer layer and an active layer formed on the patterned layer, for example by Lateral Epitaxial Overgrowth (LEO), and including one or more light emitting species. The patterned layer comprises a patterned, perforated or pierced mask (made of insulating, semiconducting or metallic material) and materials filling holes in the mask. The patterned layer, due to a large index difference with the active layer and/or variations of the refractive index between the mask and materials filling holes in the mask, both acts as an optical confinement layer and as a buried diffraction grating, thus controlling emissions of the active layer into radiative and guided modes, which are then extracted.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes new LED structures that provide increased light extraction efficiency while retaining a planar structure. The planar structure makes the new LED structures easily manufacturable at low cost.

Preferably, the structure comprises a substrate, a buffer layer grown on the substrate, a patterned layer deposited on the buffer layer, and an active layer including one or more emitting species (some of which are current-injected) formed on the patterned layer, for example by Lateral Epitaxial Overgrowth (LEO). The patterned layer comprises a patterned mask (made of insulating, semiconducting or metallic material) and materials filling holes in the mask. On top of the structure is either a single interface, or a geometrical structure (such as epoxy dome), or a DBR mirror, or a metallic mirror.

Due to the large index difference between the active layer and the patterned layer, the emission pattern of the species in the active layer can be modified, e.g. to increase or decrease the relative amount of light emitted in guided, radiative or leaky modes. Due to variation of the refractive index between the mask and the materials filling the holes in the mask, the patterned layer can act as a diffraction grating, thus enabling guided light to be emitted outside of the LED.

Technical Description

Figure 1:
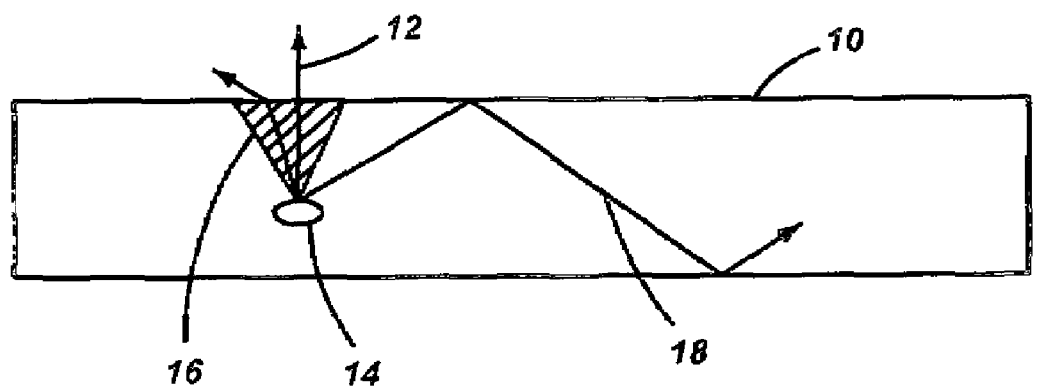
FIG. 1 is a cross-sectional view of a semiconductor light emitting diode (LED)
Figure 2:
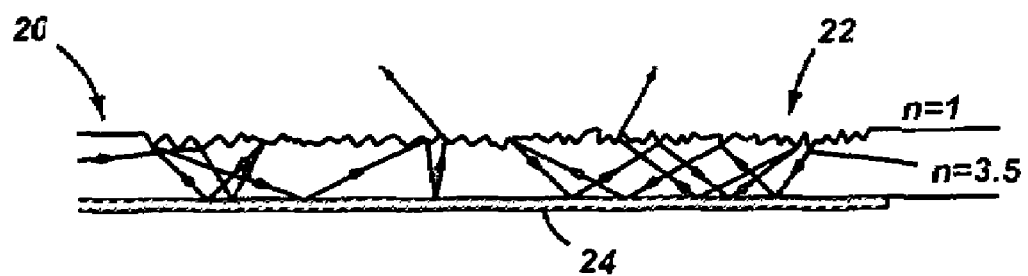
FIG. 2 is a cross-sectional view of a semiconductor LED.
Figure 3:
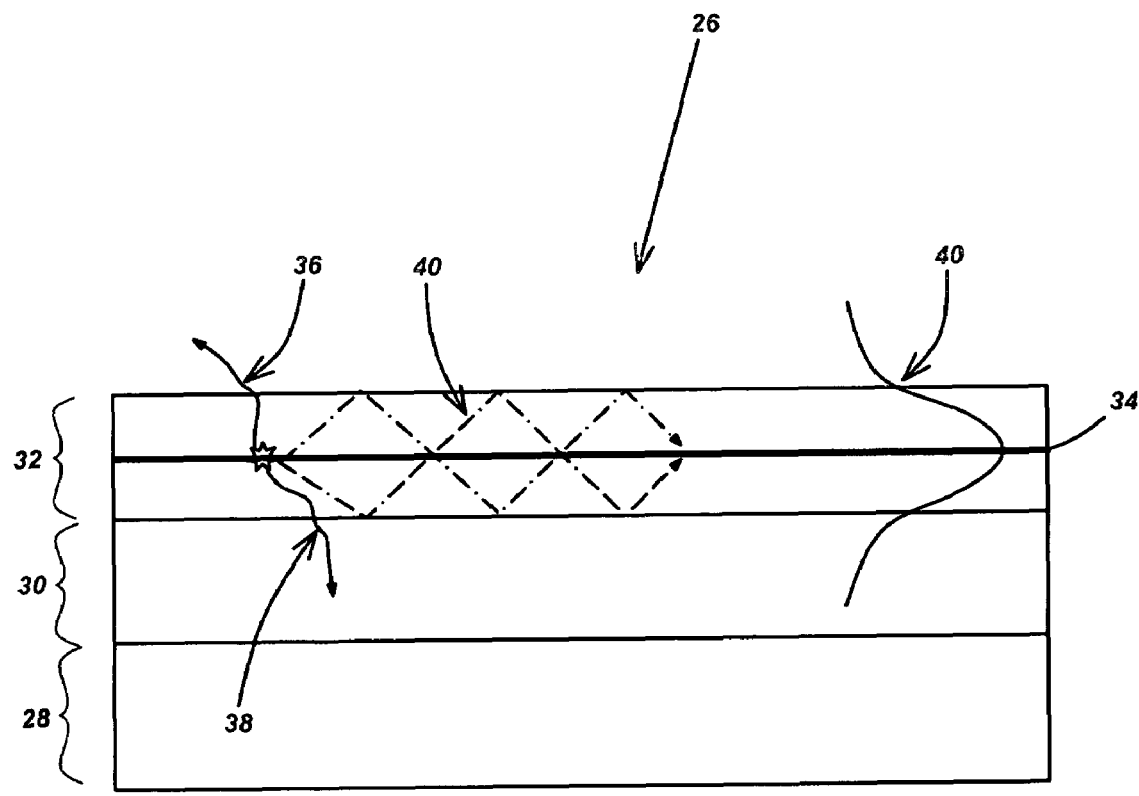
FIG. 3 is a cross-sectional view of a semiconductor LED.
Figure 4A:
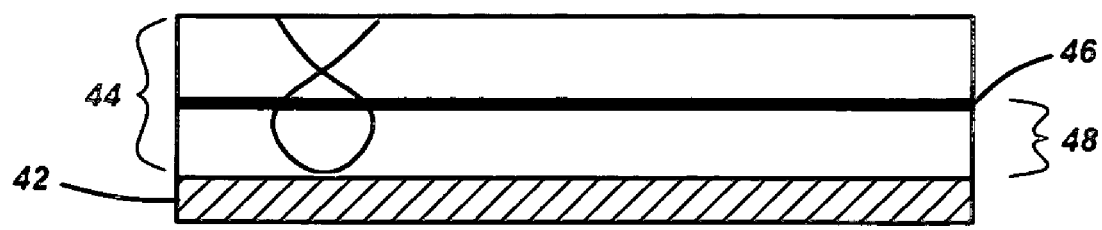
FIGS. 4A-4B and 5A-5B illustrate the structures (FIGS. 4A and 5A) and simulations (FIGS. 4B and 5B) of microcavity LED emission, via a bottom metal or distributed Bragg reflector (DBR) mirror, and a single interface with air at the top, in a gallium nitride (GaN) materials system.
Figure 4B:
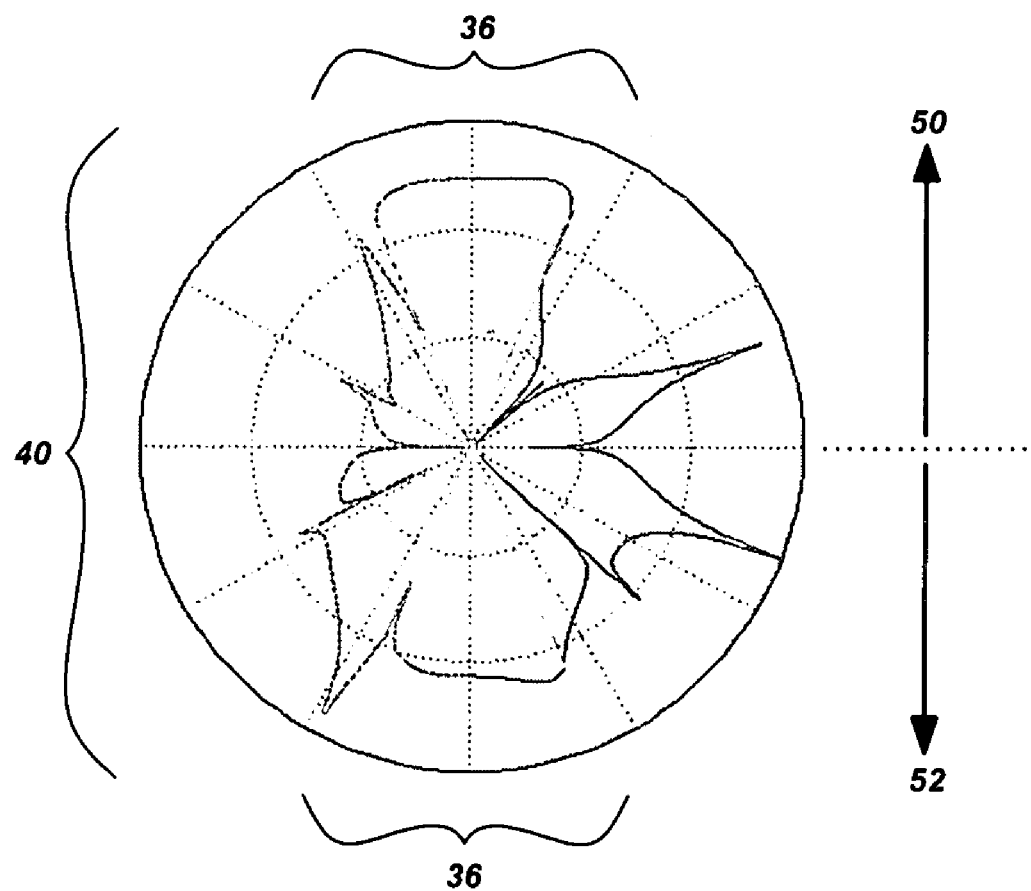
Figure 5A:
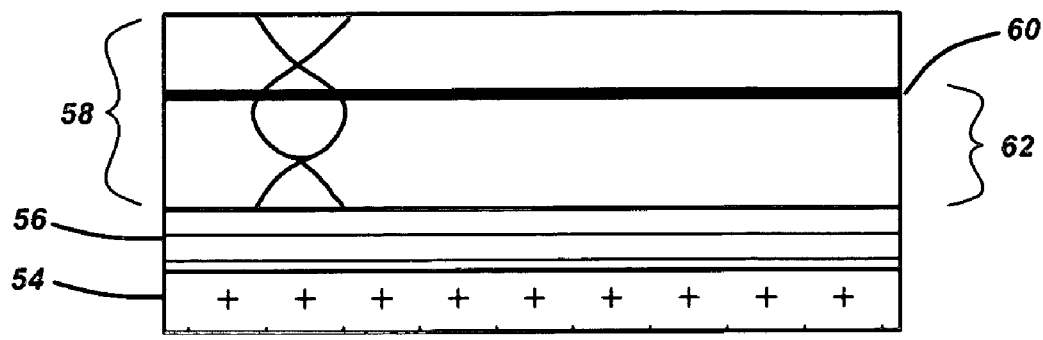
Figure 5B:
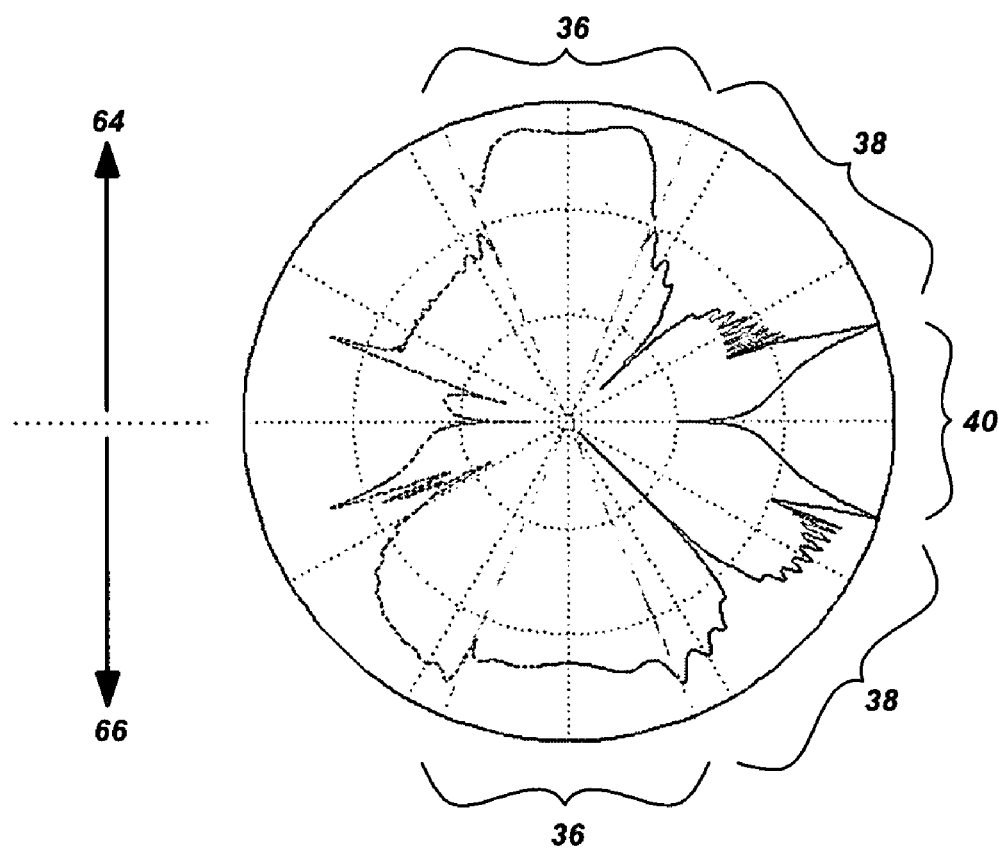
Figure 6A:
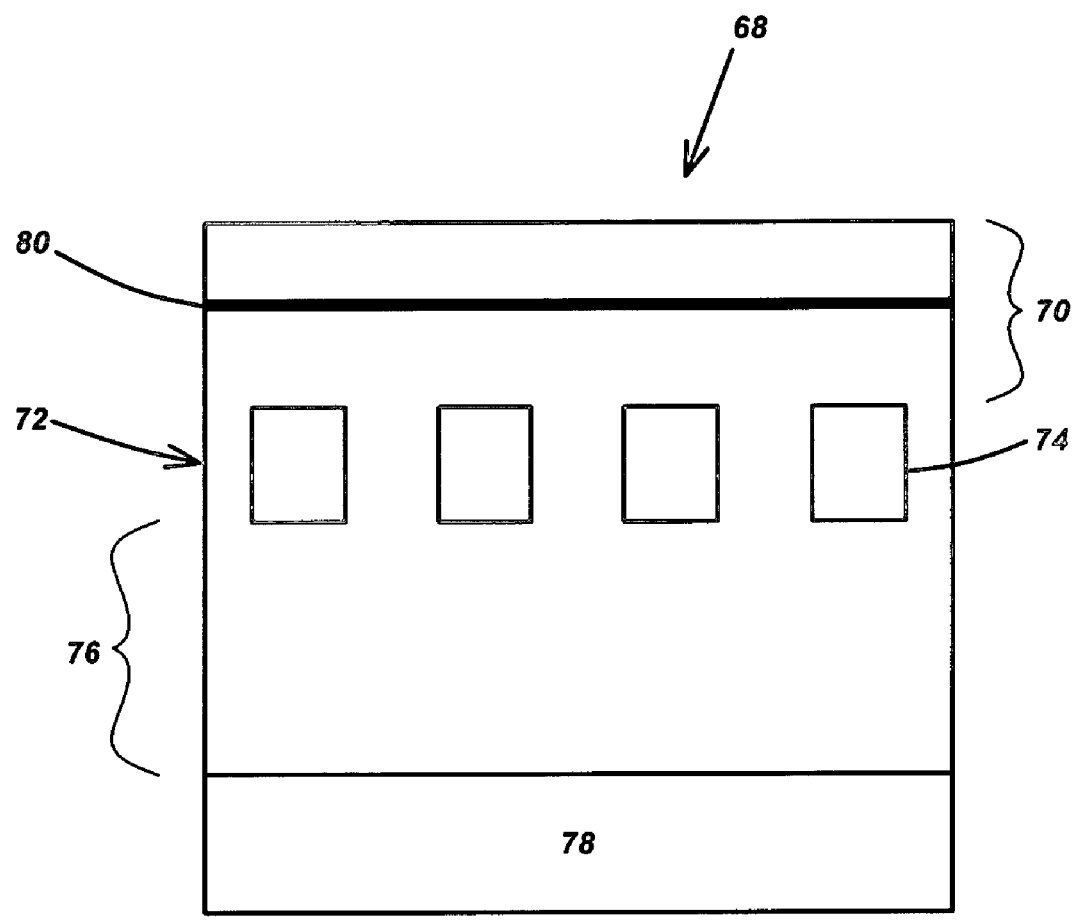
FIG. 6A is a cross-sectional side view and FIG. 6B is a cross-sectional top view of an LED according to a preferred embodiment of the present invention.
Figure 6B:
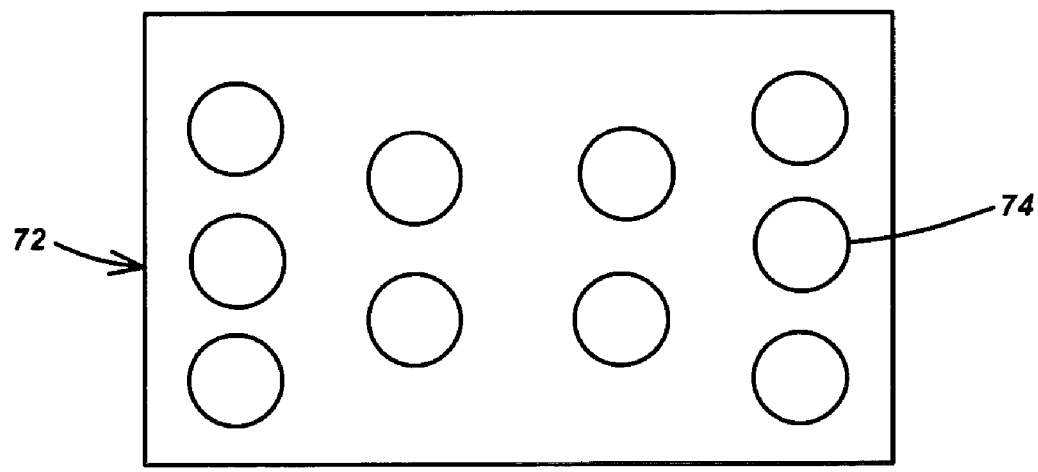

FIG. 6A is a cross-sectional side view and FIG. 6B is a cross-sectional top view of a device 68 with a 300 nm active layer 70 comprised of GaN, which is formed over a 300 nm patterned layer 72 that includes a patterned or pierced or perforated mask 74 comprised of $SiO_2$, which is deposited on a 5 micron buffer layer 76 comprised of GaN, which is grown on a substrate 78 comprised of sapphire. The patterned layer 72 uses the $SiO_2$ mask 74 as an essential component to control emissions of the active layer 70 into radiative and guided modes. The device 68 therefore requires the specific design of the patterned layer 72 and a precisely grown, thin active layer 70 containing light emitting species 80, such as quantum wells (QWs). If needed for maximal efficiency, these light emitting species 80 can be optimally positioned in the active layer 70.

Figure 7:
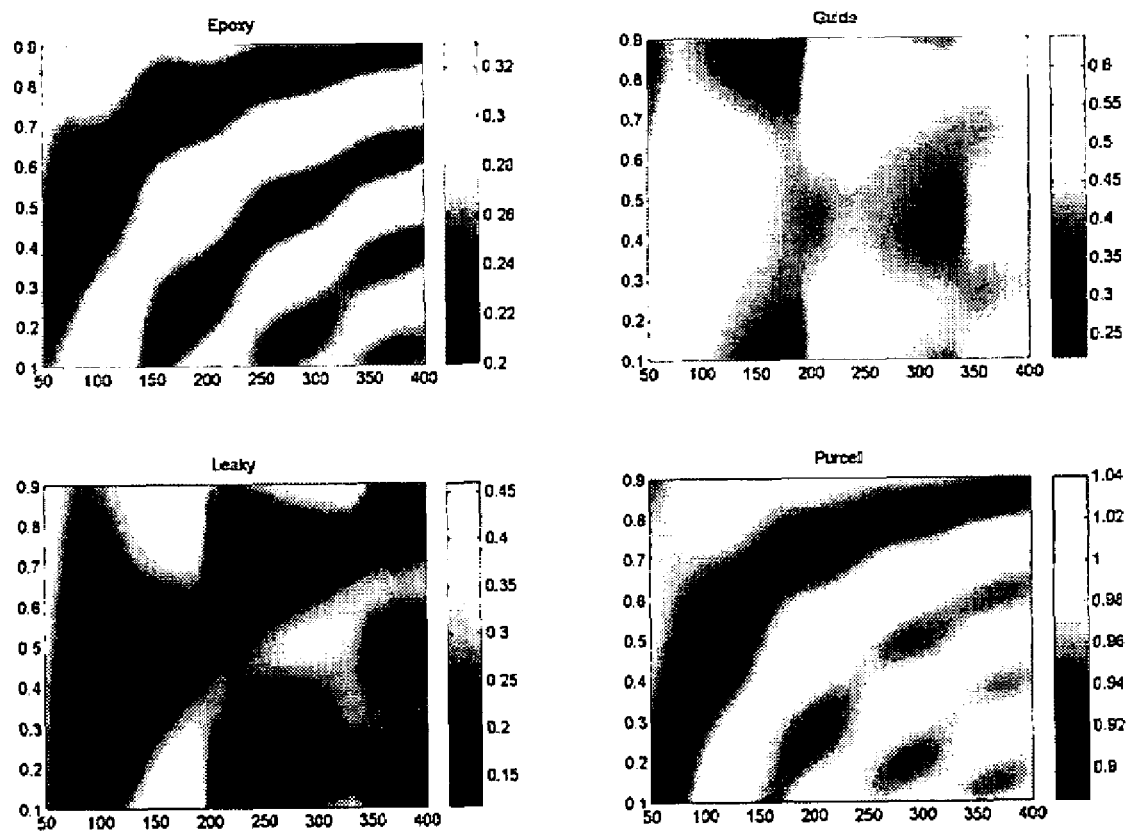
FIG. 7 illustrates a simplified simulation of the emission properties of a Lateral Epitaxial Overgrowth (LEO) grown micro-cavity LED with a patterned layer comprising a mask covering 50% of the surface.

An immediate advantage of such a structure is that, in the case where the active layer is grown by LEO, using the patterned layer as a growth mask, the grown material should be of excellent opto-electronic quality, as is well known from previous studies of LEO growth. FIG. 7 illustrates a simplified simulation of the emission properties of an LEO grown micro-cavity LED made of GaN material, with a 300 nm thick patterned layer comprised of a patterned $SiO_2$ mask covering 50% of the surface and GaN filling holes in the mask. Then, using known indices, the fractions of light emitted into the air, guided or leaky modes can be calculated as a function of active layer thickness and of emitter (i.e., QW) placement in the active layer. The simplified simulation shows the well controlled emission properties of such structures: only 15-20% of light is emitted in leaky modes, meaning that at least 80% of light can be recovered.

Also shown in FIG. 7 is the relative total emission rate (Purcell effect). The efficiencies and Purcell effect are plotted as grey scale against the GaN layer thickness above the $SiO_2$ top (horizontal axis) and the relative position of the emitting quantum well in that layer relative to the top of the $SiO_2$ layer (vertical axis).

Regions can be found (i.e., layer thickness 270 nm, QW position at 70% of that value) where most of the light is emitted directly or in guided modes (leaky modes are below 15%), with a direct extraction efficiency in the 30% range and 55% of light emission in guided modes.

Figure 8:
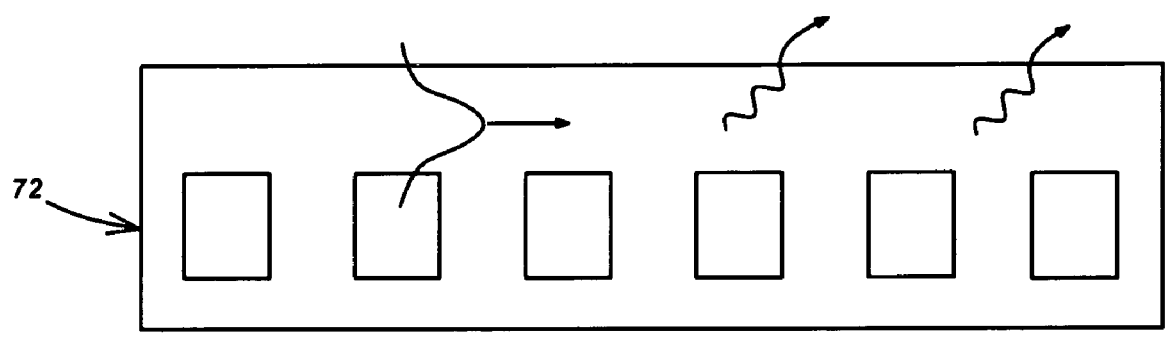
FIG. 8 illustrates extraction of a guided mode by diffraction using the patterned layer as a diffraction grating according to a preferred embodiment of the present invention.

FIG. 8 illustrates extraction of the guided mode by diffraction using the patterned layer 72 as a diffraction grating. Simulations show that extraction efficiencies in the 80% range are possible. Depending on the hole pattern and sizes in the patterned mask, and also on the use of metallic mirrors placed on top or at the bottom of the device structure, emission can occur to the top or the bottom of the device.

Figure 9:
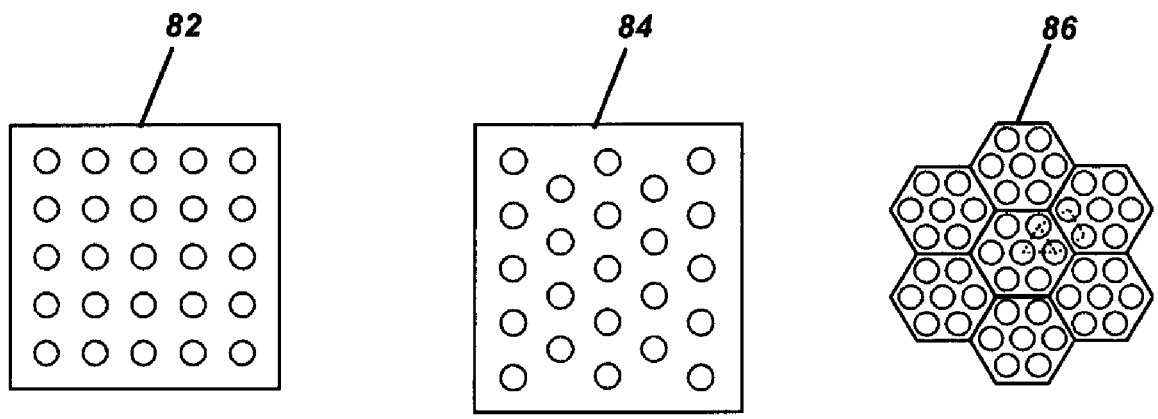
FIG. 9 illustrates various geometries that can be used as for the patterns, perforations or piercings in the patterned layer according to a preferred embodiment of the present invention.

Various geometries can be used as for the patterns, perforations or piercings in the mask 74 of the patterned layer 72. The simplest geometries are square or rectangular arrays, e.g., so-called periodic photonic crystals, illustrated as 82 and 84, respectively, in FIG. 9. More complex geometries also lead to more efficient light extraction, such as Archimedean tilings, illustrated as 86 in FIG. 9, or fractal patterns (not shown). Finally, even random patterns, which may have a characteristic correlation length in the vicinity of the wavelength, can also act as efficient light scatterers.

Figure 10:
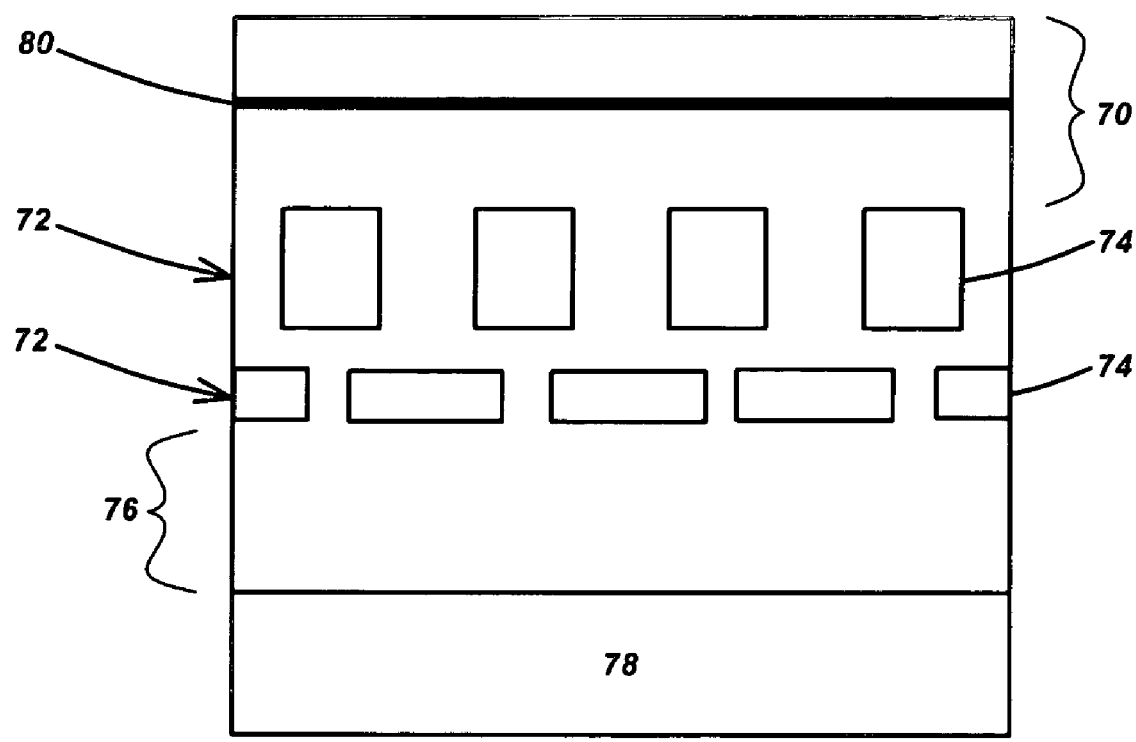
FIG. 10 is a cross-sectional side view of the active region of a device having a double patterned layer according to a preferred embodiment of the present invention.

There are many possible implementation of the concept of overgrowth on a patterned layer 72 in a thin film micro-cavity geometry. For example, two patterned layers 72, and two masks 74, and a double LEO growth can be used to improve the materials quality of the active layer 70, as shown in FIG. 10. The challenge is to obtain as good material as possible in a thin overgrowth, which is typically 200-1000 nm in thickness, to retain micro-cavity effects and extraction properties by diffraction of the patterned layer 72.

Metallic or dielectric mirrors can be placed above or below the patterned layer 72, e.g., on the top of the structure, below the patterned layer 72 or below the substrate 78, to enhance or decrease emissions in a desired direction, and to extract some of the light emitted into the leaky modes towards the substrate 78.

The mask 74 of the patterned layer 72 may be formed of insulating, semiconducting or metallic material. What is required is that the index of refraction for the mask 74 of the patterned layer 72 is different enough from that of the active layer 70 and/or that of the materials filling the holes in the mask 74.

Figure 11:
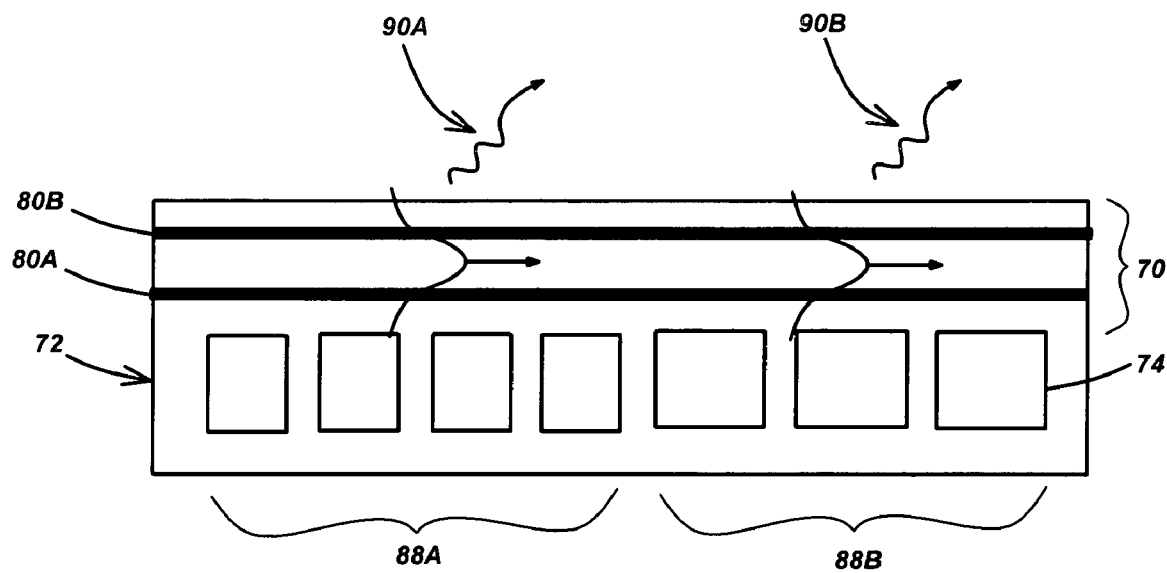
FIG. 11 is a cross-sectional side view of an active layer device with two species emitting at different wavelengths and two patterns in the patterned layer converting the guided waves into radiative modes according to a preferred embodiment of the present invention.

FIG. 11 is a cross-sectional side view of a device with two light-emitting species 80A, 80B (i.e., quantum wells) in the active layer 70 emitting at different wavelengths and two patterns 88A and 88B for the mask 74 in the patterned layer 72 converting the guided waves into radiative modes 90A and 90B, wherein 90A is associated with 80A and 90B is associated with 80B. Thus, different patterns 88A, 88B in the mask 74 of the patterned layer 72 with different periods can be used to extract 90A, 90B the various wavelengths by diffraction. Other parameters of the mask 74 in the patterned layer 72 may be varied spatially (such as holes shape, size or depth and thickness of the mask 74 and/or the patterned layer 72) in order to have different properties of the mask 74 of the patterned layer 72 in different regions of the structure.

Moreover, additional active optically-pumped regions can be used to recycle the guided modes, thus re-emitting a portion of the guided light at another frequency. For example, such a structure may be used to generate white light, if a first quantum well 80 layer emits in the blue wavelength and a second quantum well 80 layer emits in the yellow wavelength. The additional active regions can either be quantum wells of any kind, including InGaN (Zn:Si), multiple quantum dots, multiple phosphors, dyes, polymers, or molecules. Some or all of the light-emitting species may be current-injected.

Figure 12:
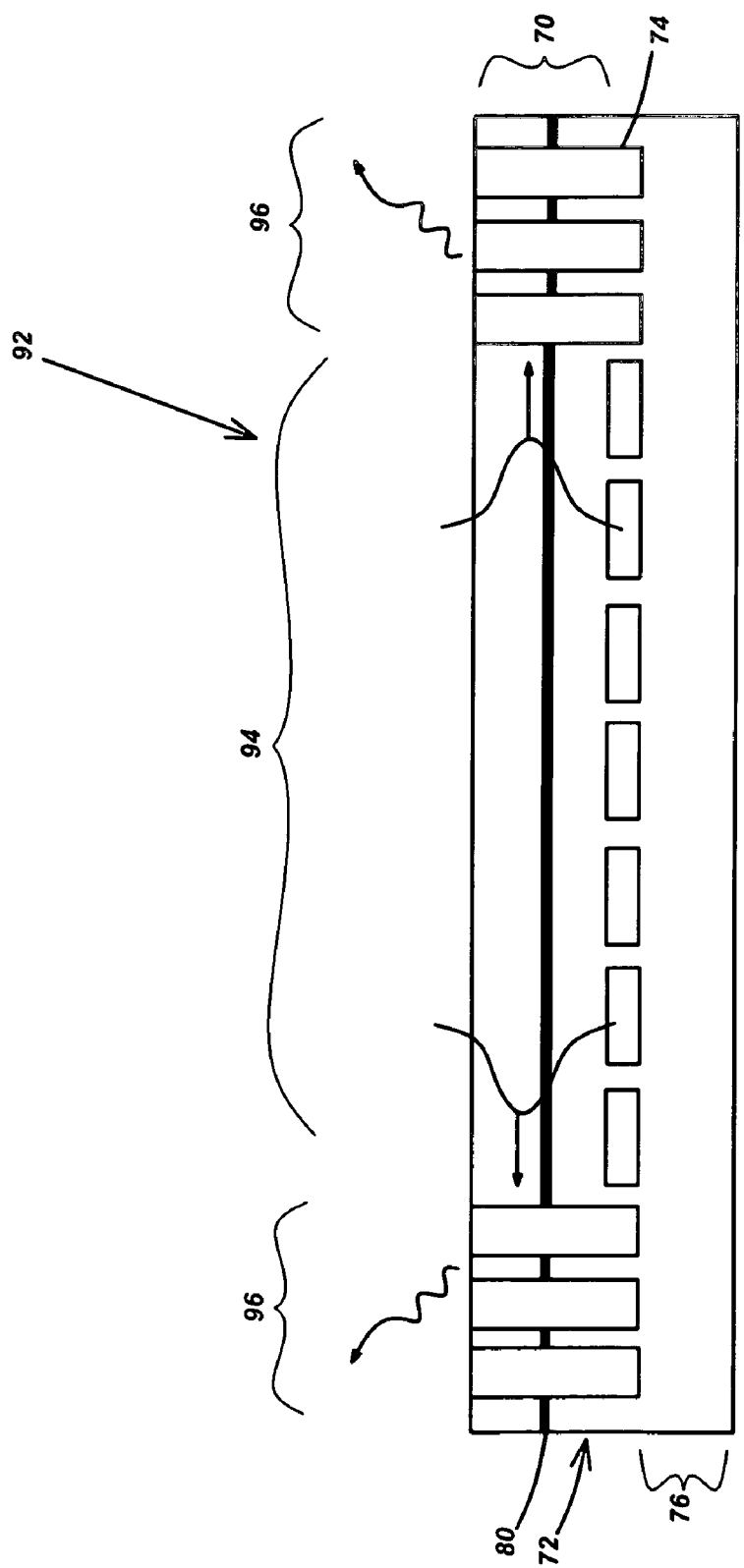
FIG. 12 is a cross-sectional side view of an LED with separate emission and diffraction regions according to a preferred embodiment of the present invention.

Another architecture provides and LED that has separate emission and extraction zones, at the periphery of the LED structure. FIG. 12 is a cross-sectional side view of an LED 92 with separate emission 94 and diffraction regions 96, 98.

Figure 13:
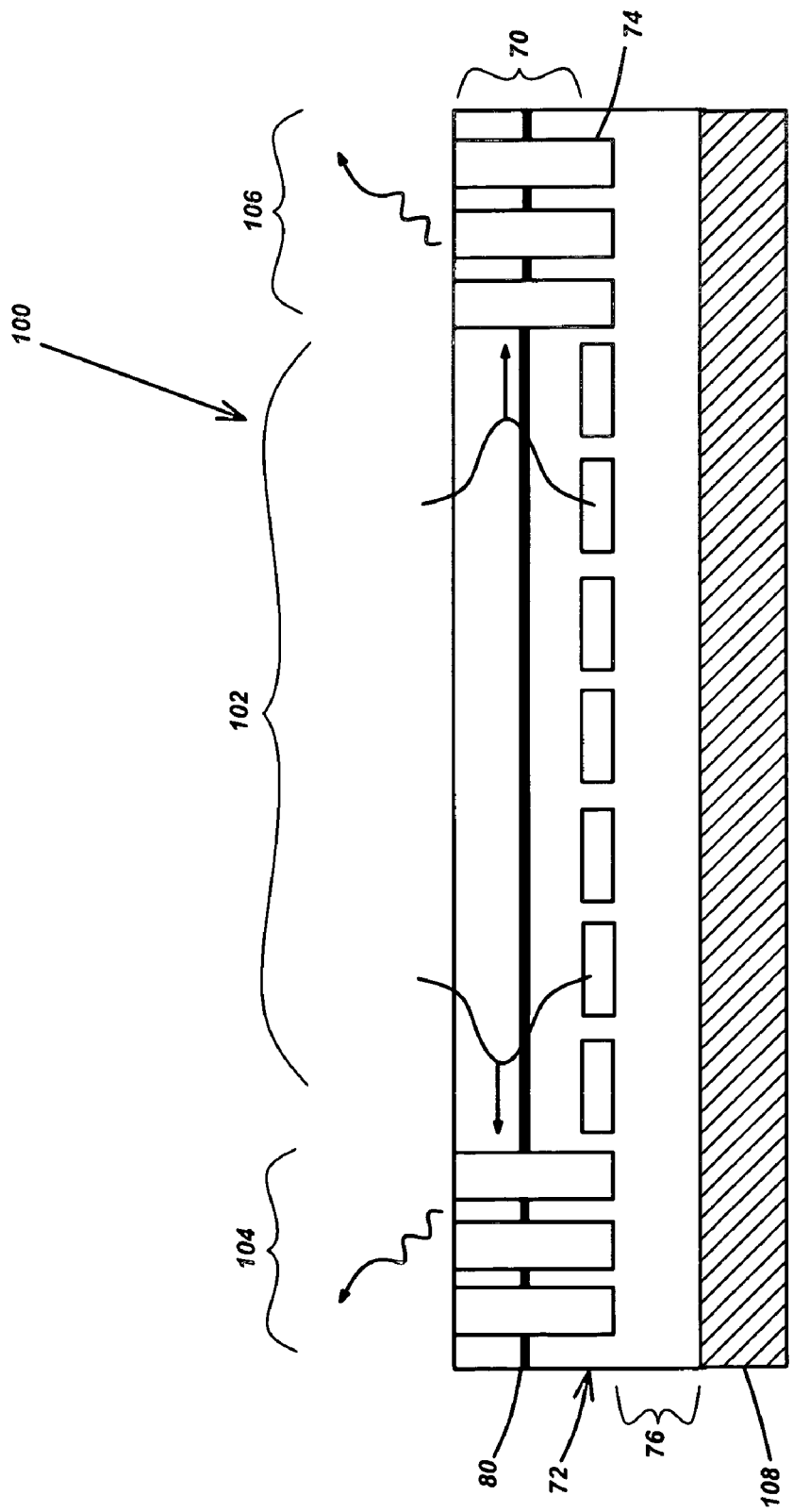
FIG. 13 is a cross-sectional side view of an LED with separate emission and diffraction regions according to a preferred embodiment of the present invention.

Variants of the present invention can include a metal mirror on top, retaining a substrate through which emission occurs, or without substrate when using a substrate lift-off technique. FIG. 13 is a cross-sectional side view of an LED 100 with separate emission 104 and diffraction regions 104, 106, wherein the LED 100 does not include a substrate, but does have a metal back contact 108.

The present invention can also act as a very directional light source, wherein emission occurs mainly in certain directions by suitable tailoring of the guided modes structure, in order to produce a directional LED. If the design of the structure is correct, only a few guided modes (ideally one) are excited and then extracted by the diffraction grating. In that case, light emission occurs in a narrow range of directions, as each guided mode is diffracted at a well-defined angle which can be chosen by tuning of the diffraction grating parameters.

Figure 14:
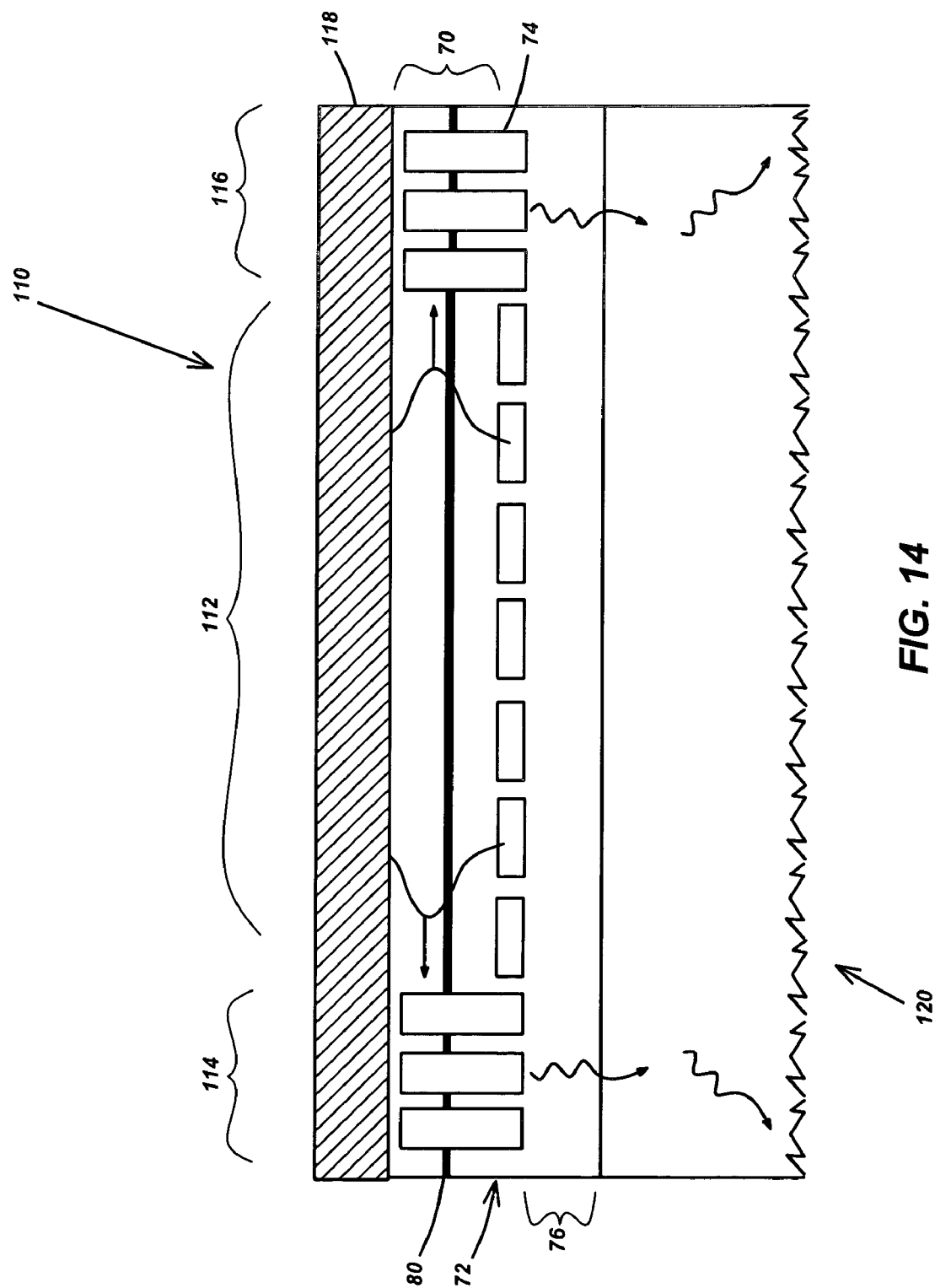
FIG. 14 is a cross-sectional side view of an LED with separate emission and diffraction regions according to a preferred embodiment of the present invention.

FIG. 14 is a cross-sectional side view of an LED 110 with separate emission 112 and diffraction regions 114, 116, wherein the LED 110 includes a metal mirror 118 on top and a roughened surface 120 on the bottom to provide disorder-assisted extraction. To extract leaky modes, roughened surfaces 120 on the back face of the device 110 can be used, wherein the roughened surfaces 120 comprise the whole back face or part of the back face, such as on its periphery.

While having been described with the example of nitride LEDs, this high efficiency LED scheme can be applied to any material that is amenable to such a fabrication technique: it can be semiconductors, but also polymer or organic molecules. In these latter cases, provided that a broad emitting species is used, one can foresee high efficiency white light emission, using specialized areas with adequate grating periods to emit light with a given color (one also suppresses direct emission at other colors by making the cavity anti-resonant for these colors). Alternately, by having mono-color emitting gratings associated with local addressing, one could have full color display with a single polymer blend.

Figure 15:
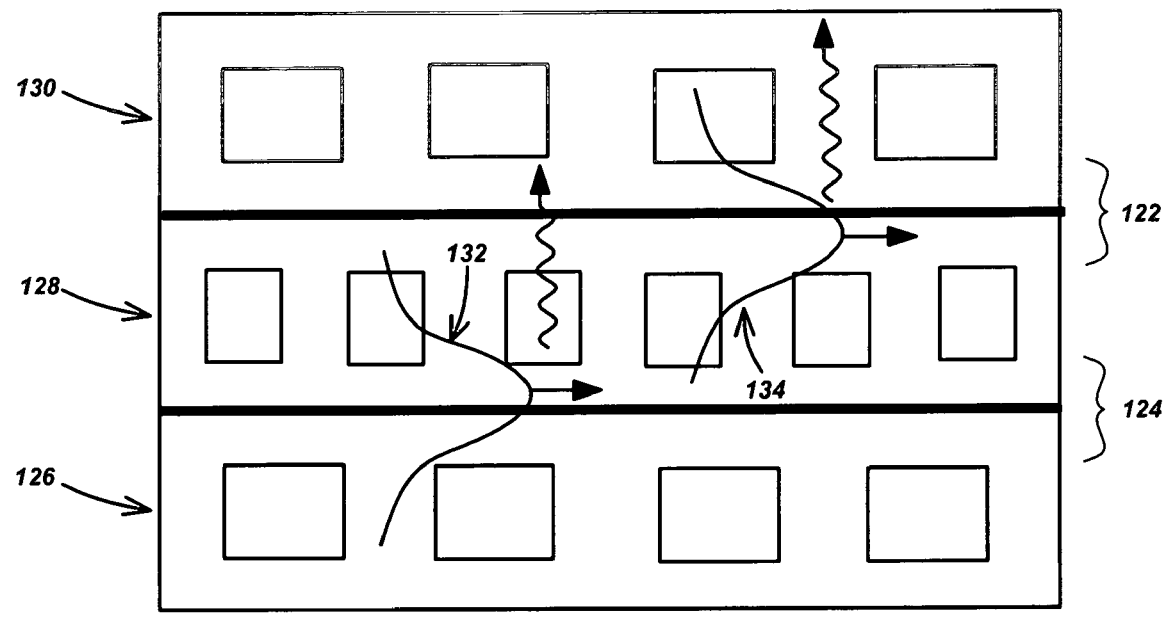
FIG. 15 is a cross-sectional side view of a LED where the two active regions are located between patterned layers according to a preferred embodiment of the present invention.

FIG. 15 is a cross-sectional side view of a LED where the two active regions 122 and 124 are located between patterned layers 126, 128 and 130 according to a preferred embodiment of the present invention. In this case, separate guided modes 132 and 134 can exist within each active region 122 and 124, so that the patterned layers 126, 128 and 130 may act preferentially on some of the modes 132 and 134. This can be useful, for instance, if the emitting species of the two active regions 122 and 124 emit at different wavelengths, as in that case, a grating may be optimized for each wavelength.

Figure 16:
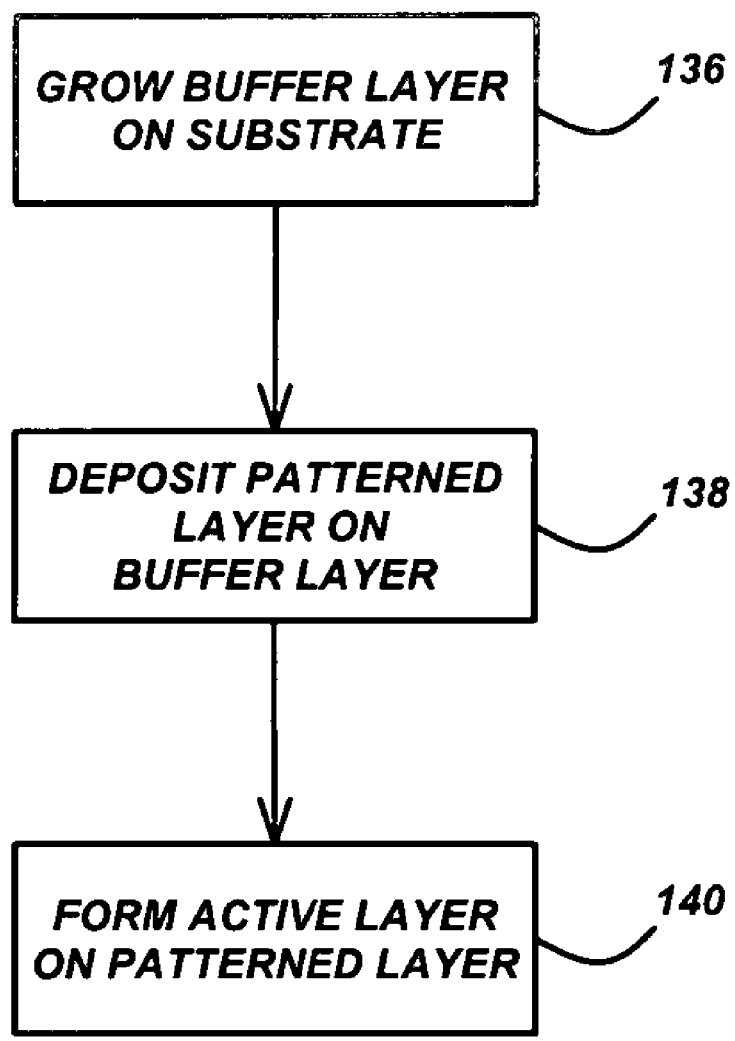
FIG. 16 is a flowchart illustrating the fabrication steps performed according to a preferred embodiment of the present invention.

Finally, FIG. 16 is a flowchart illustrating the fabrication steps performed according to a preferred embodiment of the present invention.

Block 136 represents the step of growing a buffer layer on a substrate, wherein the buffer layer is a GaN-based material.

Block 138 represents the step of depositing one or more patterned layers on top of the buffer layer using LEO, wherein each patterned layer comprises a mask and materials filling holes in the mask. Preferably, the mask is comprised of an insulating, semiconducting or metallic material, and the materials filling the holes in the mask comprise GaN-based materials that are grown by LEO. The patterned layer acts as an optical confining layer due to a contrast of a refractive index with the active layer, or as a buried diffraction grating due to variations of a refractive index between the mask and the materials filling holes in the mask. Different patterns in the patterned layer are used to extract different wavelengths by diffraction or to vary a direction of the diffraction.

Block 140 represents the step of forming one or more active layers on or between the patterned layers, wherein the active layers are a GaN-based material and include one or more light-emitting species. Preferably, the active layer is grown by LEO.

The end result of these steps is an LED, wherein the patterned layer acts as an optical confining layer due to a contrast of refractive index with the active layer and/or as a buried diffraction grating due to variation of the refractive index between the mask and the material filling holes in the mask.

REFERENCES

The following references are incorporated by reference herein:

1. U.S. Pat. No. 6,538,371, issued Mar. 25, 2003, to Duggal et al., entitled "White light illumination system with improved color output."
2. U.S. Pat. No. 6,525,464, issued Feb. 25, 2003, to Chin, entitled "Stacked light-mixing LED."
3. U.S. Pat. No. 6,504,180, issued Jan. 7, 2003, to Heremans et al., entitled "Method of manufacturing surface textured high-efficiency radiating devices and devices obtained therefrom."
4. U.S. Pat. No. 6,163,038, issued Dec. 19, 2000, to Chen et al., entitled "White light-emitting diode and method of manufacturing the same."
5. U.S. Pat. No. 5,779,924, issued Jul. 14, 1998, to Krames et al., entitled "Ordered interface texturing for a light emitting device."
6. U.S. Pat. No. 5,362,977, issued Nov. 8, 1994, to Hunt et al., entitled "Single mirror light-emitting diodes with enhanced intensity."
7. U.S. Pat. No. 5,226,053, issued Jul. 6, 1993, to Cho et al., entitled "Light emitting diode."

8. Shnitzer, et al, "30% External Quantum Efficiency From Surface Textured, Thin Film Light Emitting Diode," Applied Physics Letters 63, pp. 2174-2176, 1993.
9. M. Boroditsky, E. Yablonovitch, "Light extraction efficiency from light-emitting diodes," Proceedings of the SPIE—The International Society for Optical Engineering, SPIE-Int. Soc. Opt. Eng., 3002, pp. 119-122, 1997.
10. H. Benisty, H. D. Neve, and C. Weisbuch, "Impact of planar micro-cavity effects on light extraction/Basic concepts and analytical trends," IEEE J. Quantum Electron, vol. 34, p. 1612 (1998).
11. D. Delbeke, R. Bockstaele, P. Bienstman, R. Baets, and H. Benisty, "High-efficiency Semiconductor Resonant-Cavity Light-Emitting diodes: A review," IEEE J. on selected topics in Quantum Electron, vol. 8, no. 2, p. 189, 2002.
12. M. Rattier, Benisty, E. Schwoob, C. Weisbuch, T. Krauss, C. J. M. Smith, R. Houdre and U. Oesterle, "Omnidirectional and compact light extraction from Archimedean photonic lattices," Appl. Phys. Lett. 83, 1283, 2003.
13. M. Rattier, H. Benisty, R. Stanley, J. F. Carlin, R. Houdre, U. Oesterle, C. J. M. Smith, C. Weisbuch and T. Krauss, "Toward ultrahigh-efficiency aluminum oxide microcavity light-emitting diodes: Guided mode extraction by photonic crystals" IEEE Sel. Top. Quantum Electr. 8, 238, 2002.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A light emitting diode (LED), comprising:
   (a) one or more patterned layers, wherein each patterned layer comprises a mask and materials filling holes in the mask; and
   (b) one or more active layers formed on or between the patterned layers, wherein the active layers include one or more light emitting species;
   (c) wherein each patterned layer acts as an optical confining layer or a buried diffraction grating for the light emitting species of the active layer.
2. The LED of claim 1, further comprising a substrate and a buffer layer grown on the substrate, wherein the patterned layer is deposited on top of the buffer layer.
3. The LED of claim 2, wherein the buffer layer is a gallium nitride (GaN)-based material.
4. The LED of claim 1, wherein the patterned layer acts as an optical confining layer due to a contrast of a refractive index with the active layer.
5. The LED of claim 1, wherein the patterned layer acts as a buried diffraction grating due to variations of a refractive index between the mask and the materials filling holes in the mask.
6. The LED of claim 1, wherein the active layer is a gallium nitride (GaN)-based material.
7. The LED of claim 1, wherein the active layer is grown by Lateral Epitaxial Overgrowth (LEO).
8. The LED of claim 1, wherein the mask is comprised of an insulating, semiconducting or metallic material.
9. The LED of claim 1, where the materials filling the holes in the mask comprise gallium nitride (GaN)-based materials.
10. The LED of claim 1, wherein the materials filling hales in the mask are grown by Lateral Epitaxial Overgrowth (LEO).
11. The LED of claim 1, further comprising mirrors placed above or below the patterned layer, to enhance or decrease emissions in a desired direction.
12. The LED of claim 1, wherein different patterns in the patterned layer are used to extract different wavelengths by diffraction or to vary a direction of the diffraction.
13. The LED of claim 1, wherein additional active optically-pumped regions are used to recycle the guided modes, thus re-emitting a portion of guided modes at another frequency.
14. The LED of claim 1, wherein the LED has separate emission and extraction zones.
15. The LED of claim 1, wherein the LED has separate emission and diffraction regions.
16. The LED of claim 1, where emission from the active layers occurs mainly in certain directions by suitable tailoring of the LED's guided modes structure, in order to produce a directional LED.
17. A method of fabricating a light emitting diode (LED), comprising:
    (a) depositing one or more patterned layers, wherein each patterned layer comprises a mask and materials filling holes in the mask; and
    (b) forming one or more active layers on or between the patterned layers, wherein the active layers include one or more light emitting species;
    (c) wherein the patterned layer acts as an optical confining layer or a buried diffraction grating for the light emitting species of the active layer.
18. The method of claim 17, further comprising a substrate and a buffer layer grown on the substrate, wherein the patterned layer is deposited on top of the buffer layer.
19. The method of claim 18, wherein the buffer layer is a gallium nitride (GaN)-based material.
20. The method of claim 17, wherein the patterned layer acts as an optical confining layer due to a contrast of a refractive index with the active layer.
21. The method of claim 17, wherein the patterned layer acts as a buried diffraction grating due to variations of a refractive index between the mask and the materials filling holes in the mask.
22. The method of claim 17, wherein the active layer is a gallium nitride (GaN)-based material.
23. The method of claim 17, wherein the active layer is grown by Lateral Epitaxial Overgrowth (LEO).
24. The method of claim 17, wherein the mask is comprised of an insulating, semiconducting or metallic material.
25. The method of claim 17, where the materials filling the holes in the mask comprise gallium nitride (GaN)-based materials.
26. The method of claim 17, wherein the materials filling holes in the mask are grown by Lateral Epitaxial Overgrowth (LEO).
27. The method of claim 17, further comprising placing mirrors above or below the patterned layer, to enhance or decrease emissions in a desired direction.
28. The method of claim 17, wherein different patterns in the patterned layer are used to extract different wavelengths by diffraction or to vary a direction of the diffraction.

29. The method of claim 17, wherein additional active optically-pumped regions are used to recycle the guided modes, thus re-emitting a portion of guided modes at another frequency.

30. The method of claim 17, wherein the LED has separate emission and extraction zones.

31. The method of claim 17, wherein the LED has separate emission and diffraction regions.

32. The method of claim 17, wherein emission from the active layers occurs mainly in certain directions by suitable tailoring of the LED's guided modes structure, in order to produce a directional LED.

33. A device fabricated using the method of claim 17.

* * * * *

UNITED STATES PATENT AND TRADEMARK OFFICE
CERTIFICATE OF CORRECTION

PATENT NO. : 7,291,864 B2
APPLICATION NO. : 11/067910
DATED : November 6, 2007
INVENTOR(S) : Weisbuch et al.

It is certified that error appears in the above-identified patent and that said Letters Patent is hereby corrected as shown below:

On the Title Page:

Under References Cited, U.S. PATENT DOCUMENTS, please add:

| --6,657,236 B1 | 12/2003 | Thibeault et al. |
| 6,903,379 B2 | 06/2005 | Wang et al. |
| 7,037,742 B2 | 05/2006 | Slater, Jr. et al. |
| 7,098,589 B2 | 08/2006 | Erchak et al. |
| 2005/0082545 A1 | 04/2005 | Wierer, Jr.--. |

In the Claims:

Column 10:

Claim 10, line 7, please delete "hales" and insert --holes--.

Signed and Sealed this

Nineteenth Day of October, 2010

David J. Kappos
*Director of the United States Patent and Trademark Office*